United States Patent [19]

Chung

[11] Patent Number: 5,450,430
[45] Date of Patent: Sep. 12, 1995

[54] HIGH POWER LASER DIODE DRIVER UTILIZING A MONOLITHIC SEMICONDUCTOR DEVICE

[76] Inventor: Hyung D. Chung, 1-601 Jam Won Family Apt., Jam Won Dong, Seocho Ku, Seoul, Rep. of Korea

[21] Appl. No.: 247,064

[22] Filed: May 20, 1994

[30] Foreign Application Priority Data

Mar. 18, 1994 [KR] Rep. of Korea .............. 94-5497

[51] Int. Cl.$^6$ ............................................. H01S 3/00
[52] U.S. Cl. ............................................. 372/38; 372/29; 372/50; 372/92
[58] Field of Search .................... 378/38, 50, 29, 92

[56] References Cited

U.S. PATENT DOCUMENTS 4,817,098  3/1989  Horkawa ..................... 372/29
4,819,242  4/1989  Kaku et al. .................. 372/29

*Primary Examiner*—Leon Scott, Jr.
*Attorney, Agent, or Firm*—Nolte, Nolte and Hunter

[57] ABSTRACT

A high power laser diode driver utilizing a monolithic semiconductor device capable of eliminating the stray resistance and the stray capacitance at interconnections between an energy storage medium and an optically activated semiconductor switch, thereby generating high power laser output pulses with ultra-narrow pulsewidth, fast rise time and fast fall time at high PRF and significantly extending the capability of the diode driver. The laser diode driver includes a control unit for controlling an input drive signal, an electric power conditioning and pulse charging unit for receiving the drive signal controlled in the control unit and thereby generating an electrical energy, a triggering light source and drive unit for receiving a control signal from the control unit and generating a low power, triggering optical light, an optically activated monolithic semiconductor unit for converting the capacitively charged electrical energy into a traveling wave and then a high current impulse while being optically activated by the triggering optical light from the triggering light source and drive unit, and a high power laser array for converting the high current impulse received from the optically activated monolithic semiconductor unit into a high power, optical pulse to be outputted.

9 Claims, 4 Drawing Sheets

Bias Voltage

Triggering Optical Pulse Amplitude

Turn-on Time of the Triggering Optical Pulse

Turn-off Time of the Triggering Optical Pulse

Output Laser Pulse Amplitude $$PW = \frac{2 \times \sqrt{\varepsilon_r \times L}}{3 \times 10^{10}} \ (S)$$

HIGH POWER LASER DIODE DRIVER UTILIZING A MONOLITHIC SEMICONDUCTOR DEVICE

BACKGROUND OF THE INVENTION

1. Field of the Invention

The present invention relates to a laser diode driver, and more particularly to a high power laser diode driver utilizing a monolithic semiconductor device capable of generating the high peak power, high pulse repetition frequency (PRF), laser pulses with pulse width of a few nanoseconds and significantly extending the capability of the diode driver.

2. Description of the Prior Art

We have already proposed a high power, high PRF, compact, pulsed laser diode driver in the pending U.S. patent application Ser. Nos. 08/215,228 and 08/215,287, both filed Mar. 31, 1994. This driver realizes utilization of the non-uniform impedance stripline as energy storage capacitor and optically activated semiconductor switch as high power switch. Such a utilization results in a highly efficient, extremely compact and highly capable laser diode driver circuit. In this scheme, the output pulse width of the high power laser diodes is determined by the two way wave transit time in the energy storage medium, namely, non-uniform impedance stripline. In an ideal operating condition, the output pulse width of the high power laser diodes is about two way wave transit time in the energy storage medium. Therefore, as the energy storage medium becomes smaller, the output pulse width of the laser light becomes short.

For the generation of the high peak power, high PRF, laser pulses with pulse width of a few nanoseconds, utilization of the non-uniform impedance stripline structure as the energy storage capacitor and optically activated switch as the high power switch is very effective way. However, due to practical reasons such as eye safety, effective distance, precision and high speed data communications, it is highly desirable to produce high peak power laser pulses with the narrowest pulse width. Therefore, for the generation of the high power laser light with narrow pulse width, the physical length of the energy storage medium has to be reduced. But as the physical length of the energy storage medium becomes very small, the effects of stray inductance and stray capacitance on the circuit performance become very serious. As a consequence, there will be severe degradation on the pulse rise and fall times as well as the pulse amplitude.

Hence, merely reducing the physical length of the energy storage medium may not produce high current pulses with pulse width less than a few nanoseconds. The stray inductance as well as the stray capacitance at interconnections have to be minimized.

SUMMARY OF THE INVENTION

Therefore, an object of the invention is to provide a high power laser diode driver utilizing a monolithic semiconductor device capable of eliminating the stray resistance and the stray capacitance at interconnections between an energy storage medium and an optically activated semiconductor switch, thereby generating high power laser output pulses with ultra-narrow pulse-width, fast rise time and fast fall time at high PRF and significantly extending the capability of the diode driver.

In accordance with the present invention, this object can be accomplished by providing a high power laser diode driver utilizing a monolithic semiconductor device consisting of an energy storage medium for storing electrical energy therein and an optically activated semiconductor switch for converting a capacitively charged electrostatic energy into a high current impulse while being turned on by light received from a triggering light source and drive means, both of said energy storage medium and said semiconductor switch being integrated onto a single semiconductor substrate.

BRIEF DESCRIPTION OF THE DRAWINGS

Other objects and aspects of the invention will become apparent from the following description of embodiments with reference to the accompanying drawings in which:

FIGS. 2a and 2b illustrate an optically activated monolithic semiconductor device consisting of an energy storage medium and an optically activated vertical semiconductor switch in accordance with the present invention, wherein FIG. 2a is a plan view of the monolithic semiconductor device, and FIG. 2b is a cross-sectional view taken along the line A—A of FIG. 2a;

FIGS. 3a and 3b illustrate another optically activated monolithic semiconductor device consisting of an energy storage medium and an optically activated lateral semiconductor switch in accordance with the present invention, wherein FIG. 3a is a plan view of the monolithic semiconductor device, and FIG. 3b is a cross-sectional view taken along the line A—A of FIG. 3a.

DETAILED DESCRIPTION OF THE PREFERRED EMBODIMENTS

Figure 1:
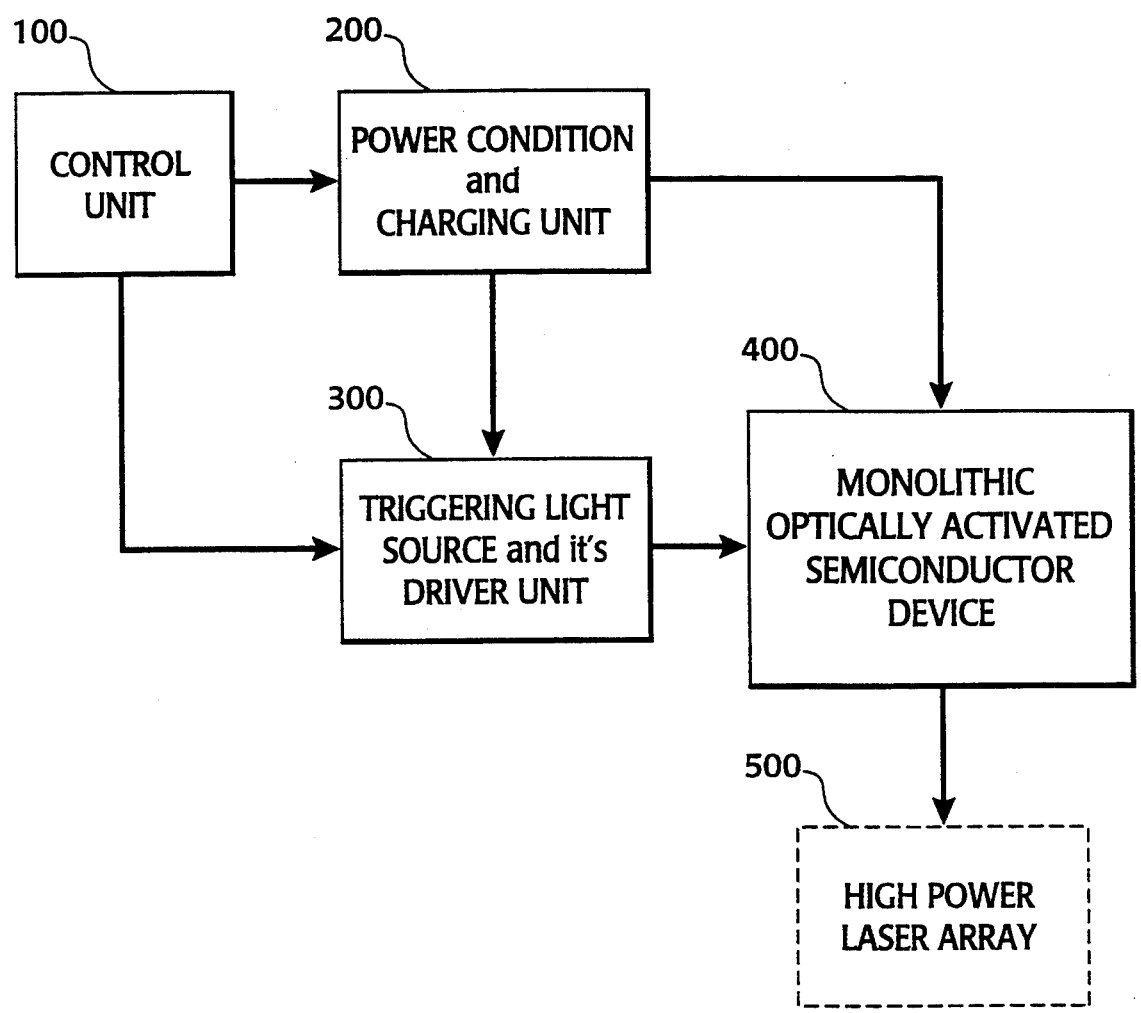
FIG. 1 is a block diagram of a laser diode driver in accordance with the present invention.

FIG. 1 is a block diagram of a high power, pulsed laser diode driver to which the present invention is applied. As shown in FIG. 1, the pulsed laser diode driver comprises a control unit 100, an electric power conditioning and pulse charging unit 200, a triggering light source and drive unit 300, an optically activated monolithic semiconductor unit 400, and a high power laser array 500.

The control unit 100 controls a signal introduced from an input stage and sends the controlled signal to the electric power conditioning and pulse charging unit 200. The control unit 100 also applies a signal to the triggering light source and drive unit 300. The electric power conditioning and pulse charging unit 200 conditions the prime electrical energy derived from either AC power line or battery by the signal from the control unit 100 and then sends certain energy to the triggering light source and drive unit 300. The electric power conditioning and pulse charging unit 200 also sends certain energy to the optically activated monolithic semiconductor unit 400. The triggering light source and drive unit 300 serves to trigger the prime electrical energy received from the electric power conditioning and pulse charging unit 200 and thereby output optical laser light of low or middle power at the monolithic semiconductor unit 400.

The monolithic semiconductor unit 400 is consisted of an energy storage medium for storing electrical energy therein and an optically activated semiconductor switch for converting the capacitively charged electrostatic energy into the high current impulse while being turned on by the laser light received from the triggering light source and drive unit 300. The functions of the energy storage medium and the semiconductor switch are integrated onto a single semiconductor substrate.

The high power laser array 500 outputs the high current impulse converted in the optically activated monolithic semiconductor unit 400 in the form of high power, optical pulse.

By signal from the control unit 100, the prime electrical energy, derived from either AC power line or battery, is conditioned and then used to capacitively charging the energy storage medium, such as capacitor, of the monolithic semiconductor device 400. As the optical light from the triggering optical source and drive unit 300 introduced into the optically activated switch, the capacitively charged electrostatic energy converts into the high current impulse to be sent to the high power laser array 500. As a result, the high power laser array 500 outputs the high power, optical pulse.

In FIGS. 2a to 3b, there are illustrated optically activated monolithic semiconductor devices in accordance with the present invention. On the other hand, FIGS. 4a to 4c are waveform diagrams respectively illustrating the graphical sequences of the energy flow of the laser diode driver in accordance with the present invention.

In accordance with the present invention, the pulsed laser driver uses the monolithic semiconductor devices, respectively shown in FIGS. 2a and 2b, and FIGS. 3a and 3b, in which they combine the functions of the energy storage capacitor and the optically activated switch onto a single semiconductor substrate. The optically activated monolithic device, shown in FIGS. 2a and 2b, consists of energy storage medium and vertical semiconductor switch having a fan shaped non-uniform stripline structure or a concentric strip shaped non-uniform stripline structure. In particular, the vertical switch structure allows extension of the geometry of a monolithic device incorporating vertical switch structure into a complete circular shape.

Figure 3A:
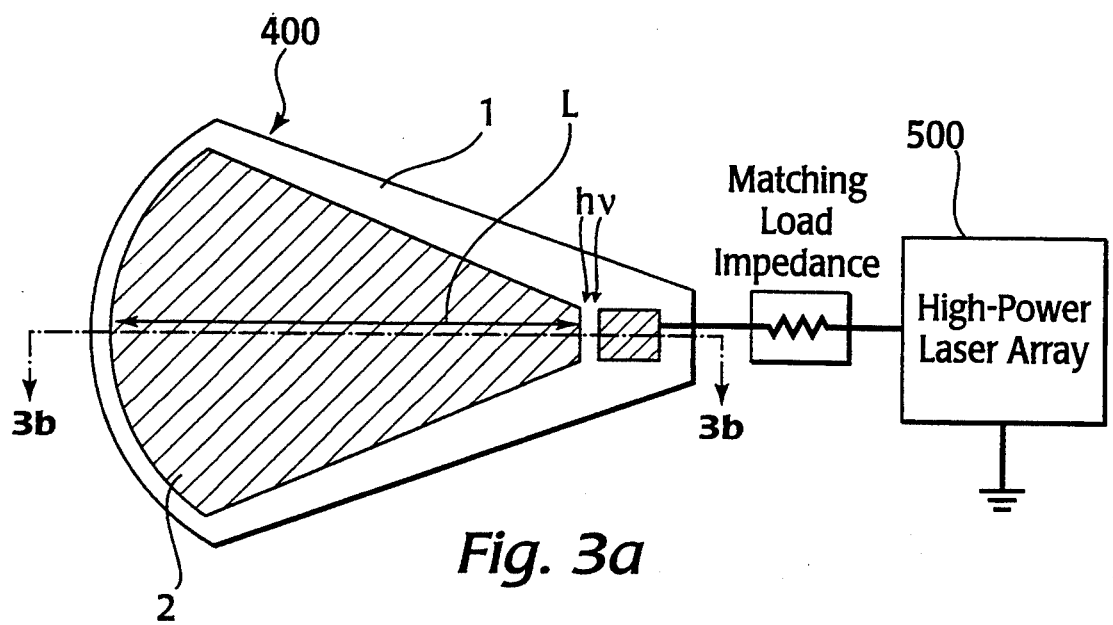
Figure 3B:
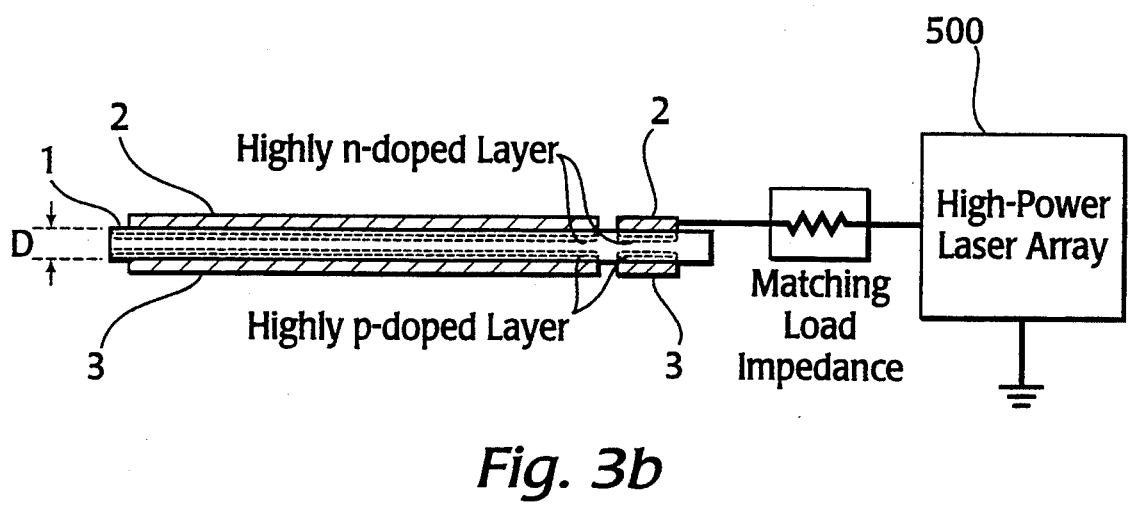
Figure 4A:
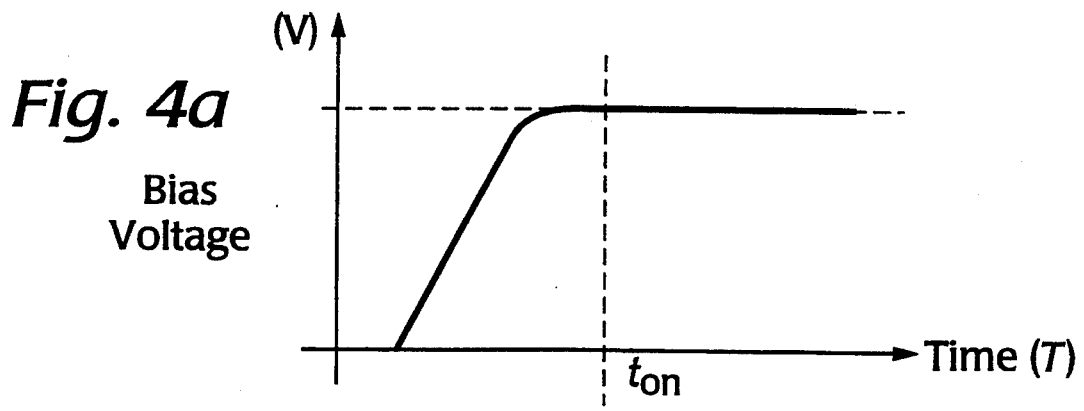
FIGS. 4a to 4c are waveform diagrams respectively illustrating the graphical sequences of the energy flow of the laser diode driver in accordance with the present invention.
Figure 4B:
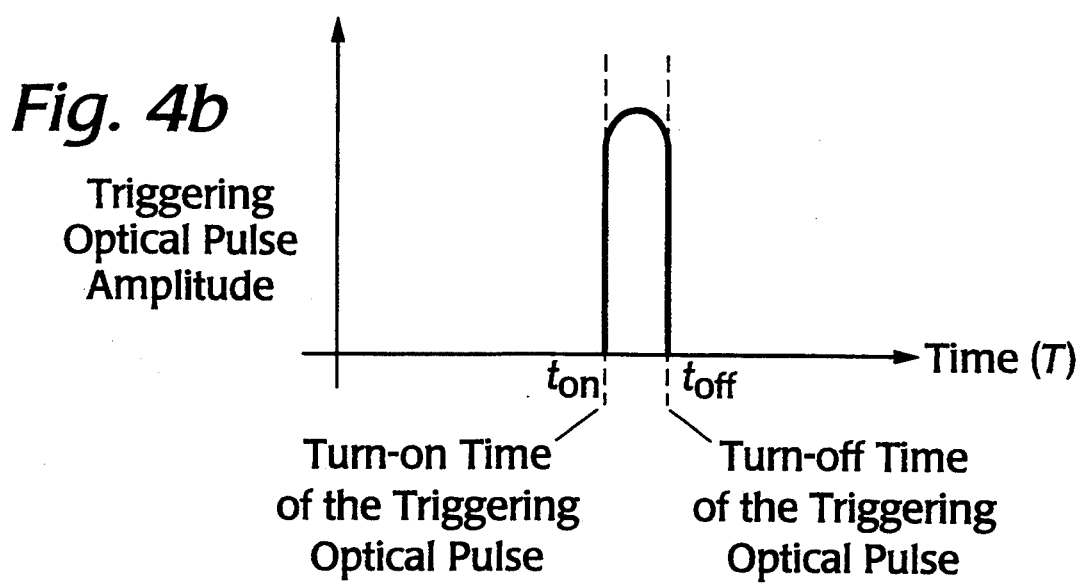
Figure 4C:
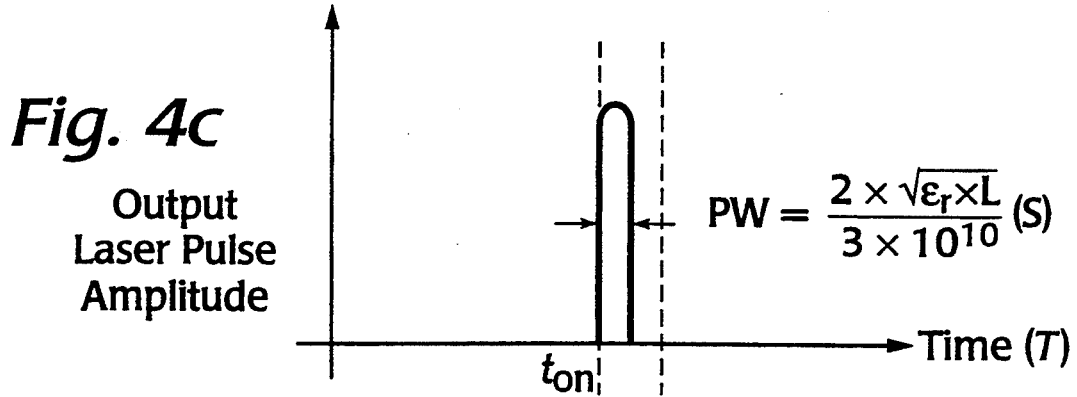

Meanwhile, the optically activated monolithic device, shown in FIGS. 3a and 3b, consists of energy storage medium and lateral semiconductor switch.

Figure 2A:
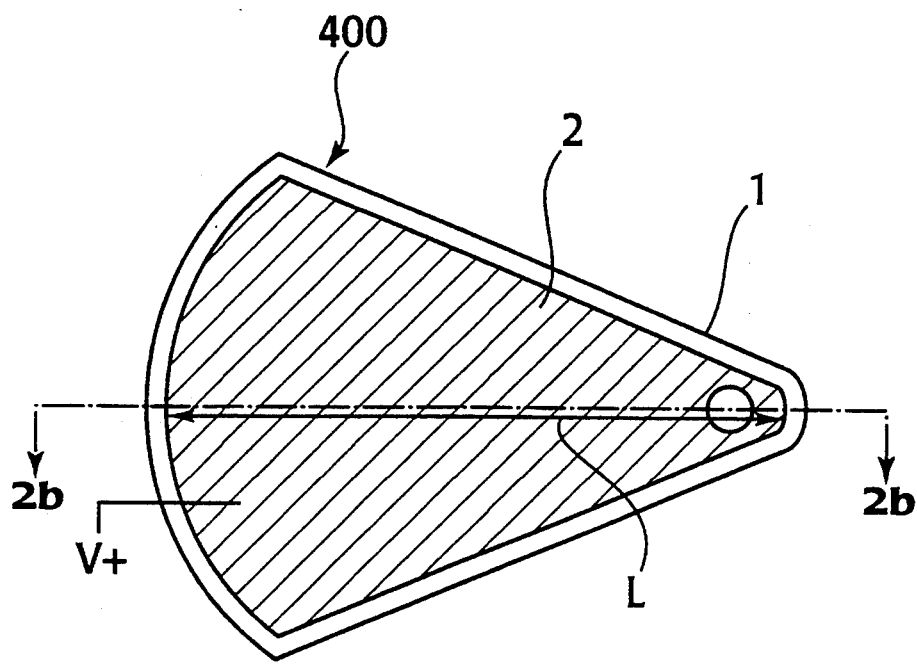
Figure 2B:
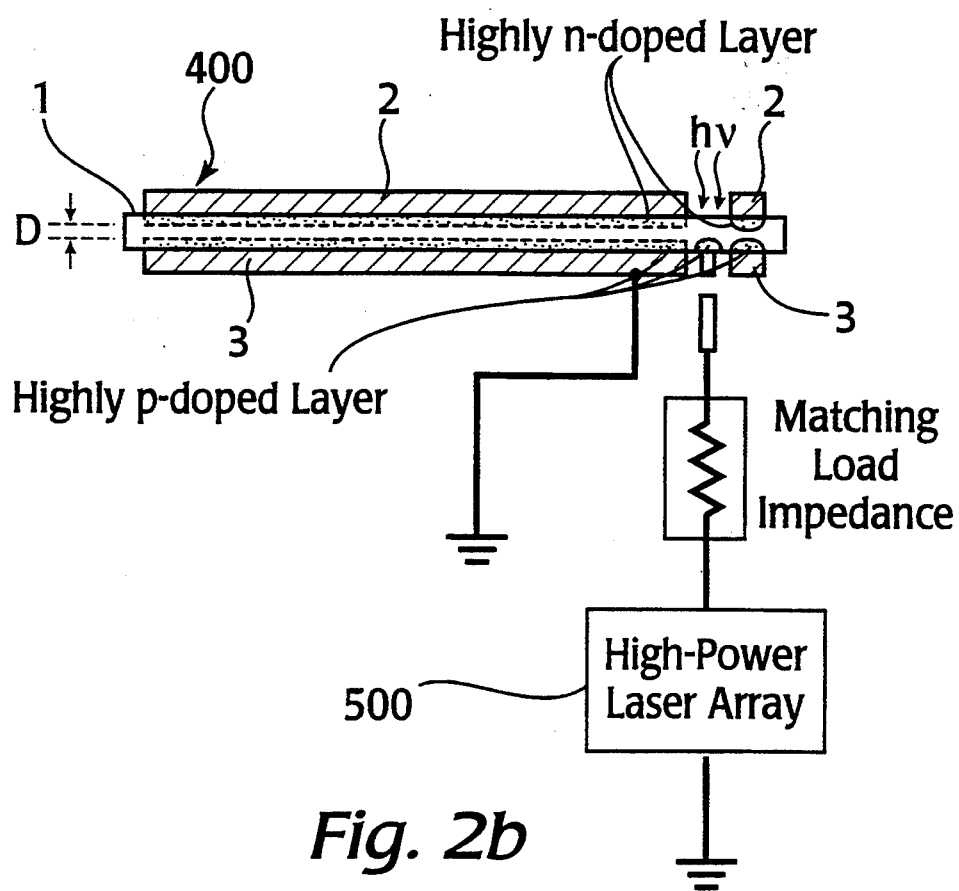

The energy storage medium is created by metallizing electrodes on both sides of the semiconductor substrate. The structure of the energy storage medium, shown in FIGS. 2b and 3b, is n-i-p. The capacitance of the monolithic energy storage capacitor can be expressed by the following equation:

$$C = \epsilon_0 \times \epsilon_r \times A/d. \text{ Farad } (F)$$

where $\epsilon_0$ is the permittivity of the material, $\epsilon_r$ is the dielectric constant of the dielectric material, A is the area of the electrode, and d is the thickness of the device, respectively. The expected output laser pulse width from this monolithic device can be expressed by the following equation:

$$PW = 2 \times t = \{2 \times \sqrt{\epsilon_r} \times L(cm)\}/\{3 \times 10^{10}(cm/s)\}, \text{ second } (s)$$

where t is the one-way wave transit time in the energy storage medium and L is the electrode length between inner and outer edges of the energy storage medium.

The laser diode triggered semiconductor switches can be either a vertical n-i-p switch, shown in FIG. 2b, or a lateral n-i-p switch, shown in FIG. 3b.

For a monolithic, optically activated semiconductor device with a vertical n-i-p switch, the triggering optical pulse is introduced into an active area through open hole on the n-type layer. However, a monolithic semiconductor device with a lateral n-i-p switch can be activated by illuminating the switch either from top or from bottom.

The action of the driver starts by forwarding the operating instruction to the control unit 100 which initiates sequence of actions. At first the electric power conditioning and pulse charging unit 200 is activated. The prime power from either AC power line or battery is conditioned and used to pulse charging the capacitor which is the energy storage medium of the optically activated monolithic semiconductor unit 400.

At the time the pulse biasing voltage is reached the peak voltage, the driver circuit for the triggering laser diode of the triggering light source and drive unit 300 generates a fast rise time triggering optical pulse at very high PRF. Then the generated triggering optical pulse is introduced into the semiconductor switch of the monolithic semiconductor unit 400.

Once a triggering optical light is penetrated into the active area of the semiconductor switch, it produces sufficient numbers of the photon-generated electron-hole pairs so that the state of the switch changes from completely open (non-conducting) to completely closing (conducting). With the switch turn-on, the electrostatic energy stored in the monolithic semiconductor unit 400 becomes traveling wave and delivers to the high power laser array 500 as a form of high current impulse. The sequential events of the energy flow is given in FIGS. 4a, 4b and 4c.

As apparent from the above description, the present invention provides a high power laser diode driver utilizing a monolithic semiconductor device constructed by integrating an energy storage medium and an optically activated semiconductor switch onto a single semiconductor substrate. By the utilization of such a monolithic semiconductor device, the diode driver of the present invention can eliminates the stray resistance and the stray capacitance at interconnections, unlike the circuit employing discrete components. The diode driver is also able to generate high power laser output pulses with ultra-narrow pulsewidth, fast rise time and fast fall time at high PRF.

Further, by integrating the functions of the energy storage medium and the switch onto a single semiconductor substrate, the capability of the diode driver is significantly extended. Therefore, a diode driver utilizing a monolithic, optically activated semiconductor device results in a highly efficient, extremely compact and lightly weighted, pulsed laser diode driver.

Although the preferred embodiments of the invention have been disclosed for illustrative purposes, those skilled in the art will appreciate that various additions and substitutions are possible, without departing from the scope and spirit of the invention as disclosed in the accompanying claims.

What is claimed is:

1. A laser diode driver which controls an input drive signal to generate a low power triggering optical light, and thereby release an electrical energy to generate a traveling wave and then a high current impulse, and then into a high power optical pulse, said diode driver comprising:

control means for controlling the input drive signal;

electric power conditioning and pulse charging means for receiving said drive signal controlled in said control means and thereby generating the electrical energy;

a triggering light source;

drive means for powering the triggering light source and for thereby generating the low power, triggering optical light;

a semiconductor switch means for activation by the low power optical light and for converting the electrical energy into the traveling wave and then the high current impulse while being optically activated by said triggering optical light from said triggering light source and drive means; and a high power laser array for converting said high current impulse received from said optically activated semiconductor switch means into the high power, optical pulse.

2. A laser diode driver in accordance with claim 1 wherein said monolithic semiconductor means comprises:

an energy storage medium; and a lateral semiconductor switch;

both the energy storage medium and the lateral semiconductor switch being integrated into a single semiconductor substrate.

3. A laser diode driver in accordance with claim 1 wherein said monolithic semiconductor means comprises:

an energy storage medium; and a vertical semiconductor switch having a fan shaped non-uniform stripline structure.

4. A laser diode driver in accordance with claim 1 wherein said monolithic semiconductor means comprises:

an energy storage medium; and a vertical semiconductor switch having a concentric strip shaped non-uniform stripline structure.

5. A laser diode driver which controls an input drive signal to generate a low power triggering optical light, and thereby release an electrical energy to generate a traveling wave and then a high current impulse, and then into a high power optical pulse, said diode driver comprising:

control means for controlling the input drive signal;

electric power conditioning and pulse charging means for receiving said drive signal controlled in said control means and thereby generating the electrical energy;

a triggering light source;

drive means for powering the triggering light source and for thereby generating the low power, triggering optical light;

a semiconductor switch means for activation by the low power optical light and for converting the energy into the traveling wave and then the high current impulse while being optically activated by said triggering optical light from said triggering light source and drive means; and a high power laser array for converting said high current impulse received from said semiconductor switch means into the high power, optical pulse;

wherein said monolithic semiconductor means comprises:

an energy storage medium for storing the electrical energy therein; and a semiconductor switch for converting a capacitively charged electrostatic energy into said high current impulse while being turned on by said light received from said triggering light source and drive means;

both of said energy storage medium and said semiconductor switch being integrated into a single semiconductor substrate.

6. A laser diode driver which controls an input drive signal to generate a low power triggering optical light, and thereby release an electrical energy to generate a traveling wave and then a high current impulse, and then into a high power optical pulse, said diode driver comprising:

control means for controlling the input drive signal;

electric power conditioning and pulse charging means for receiving said drive signal controlled in said control means and thereby generating the electrical energy;

a triggering light source;

drive means for powering the triggering light source and for thereby generating the low power, triggering optical light;

a semiconductor switch means for activation by the low power optical light and for converting the energy into the traveling wave and then the high current impulse while being optically activated by said triggering optical light from said triggering light source and drive means; and a high power laser array for converting said high current impulse received from said semiconductor switch means into the high power, optical pulse;

wherein said monolithic semiconductor means comprises:

an energy storage medium; and a vertical semiconductor switch;

both the energy storage medium and the vertical semiconductor switch being integrated into a single semiconductor substrate.

7. A laser diode driver in accordance with claim 6, wherein said energy storage medium comprises metallizing electrodes disposed on both sides of said semiconductor substrate to form an n-i-p structure.

8. A laser diode driver in accordance with claim 6, wherein the energy storage medium has an n-i-p structure and said n-i-p structure is of a vertical type.

9. A laser diode driver in accordance with claim 6, wherein the energy storage medium has an n-i-p structure, and said n-i-p structure is of a lateral type.

* * * * *